United States Patent [19]

Iwashita

[11] Patent Number: 4,942,450

[45] Date of Patent: Jul. 17, 1990

[54] SEMICONDUCTOR MEMORY DEVICE HAVING NON-VOLATILE MEMORY TRANSISTORS

[75] Inventor: Shinichi Iwashita, Tokyo, Japan

[73] Assignee: NEC Corporation, Tokyo, Japan

[21] Appl. No.: 216,588

[22] Filed: Jul. 8, 1988

[30] Foreign Application Priority Data

Jul. 8, 1987 [JP] Japan ................................ 62-171511

[51] Int. Cl.⁵ ............. H01L 29/78; H01L 29/34; H01L 23/48; H01L 25/04
[52] U.S. Cl. .................................. 357/54; 357/23.5; 357/71; 357/84
[58] Field of Search ................... 357/23.5, 54, 84, 71; 365/185

[56] References Cited

U.S. PATENT DOCUMENTS

| 4,758,984 | 7/1988 | Yoshida | 365/185 |
| 4,805,138 | 2/1989 | McElroy et al. | 357/84 |

FOREIGN PATENT DOCUMENTS

| 58-197777 | 11/1983 | Japan | 357/23.5 |
| 59-35477 | 2/1984 | Japan | 357/23.5 |
| 63-55977 | 3/1988 | Japan | 357/23.5 |

*Primary Examiner*—J. Carroll
*Attorney, Agent, or Firm*—Sughrue, Mion, Zinn, Macpeak & Seas

[57] ABSTRACT

A semiconductor memory device having a redundancy memory cell array is disclosed. UV-PROM's are employed as a programming means in the redundancy control section. A first impurity region is formed in the substrate and the control gate electrode of the UV-PROM is led out through the first impurity region. A second impurity region is formed in the substrate and crosses the first impurity region, and the floating gate electrode of the UV-PROM is covered by a metallic film which is contacted to the second impurity region.

4 Claims, 3 Drawing Sheets

U.S. Patent   Jul. 17, 1990   Sheet 3 of 3   4,942,450
FIG. 5A
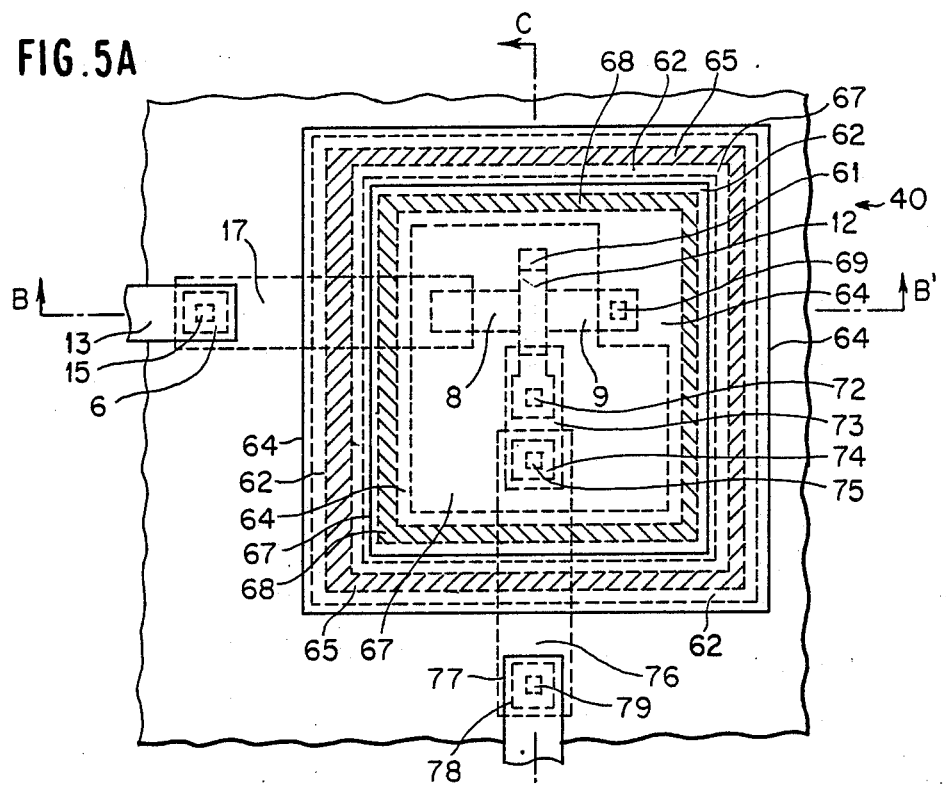
FIG. 5B
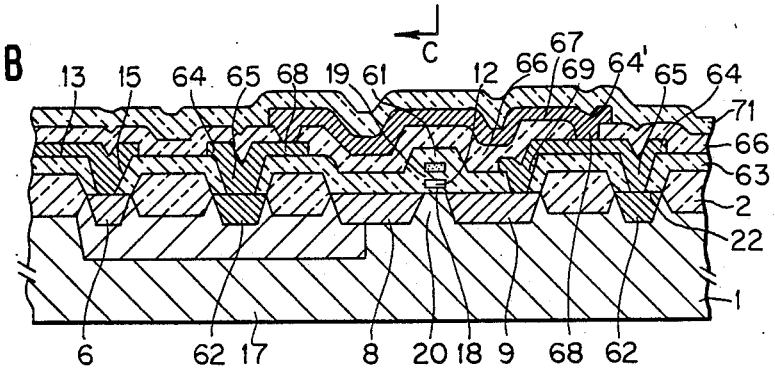
FIG. 5C

SEMICONDUCTOR MEMORY DEVICE HAVING NON-VOLATILE MEMORY TRANSISTORS

BACKGROUND OF THE INVENTION

The present invention relates to a semiconductor memory device having a plurality of non-volatile memory transistors of electrically writable and erasable by ultra-violet rays (hereinafter called as UV-PROM), and more particularly to a memory device in which a redundancy memory cell array is incorporated.

UV-PROM's are widely used in a semiconductor memory device as described in U.S. Pat. No. 4,527,259 and U.S. Pat. No. 4,727,221. On the other hand, a semiconductor memory device having a redundancy memory cell array is shown, for example, in U.S. Pat. No. 4,281,398 and U.S. Pat. No. 4,428,068, in which a main memory cell section, a redundancy memory cell section and a redundancy control section for deciding whether the redundancy memory cell section is to be used or not with respect to received address signals, are provided.

As a program means in the redundancy control section by which an information corresponding to a defect line produced in the main memory cell section is set, polysilicon fuses, UV-PROM's, EE-PROM's (electrically erasable PROM), polysilicon layers having a high electrical resistivity, etc. are employed. When UV-PROM's are used as memory cells in the main memory cell section and in the redundancy memory cell section, UV-PROM's are beneficially used in the redundancy control section as the program means in view of the high reliability of the programming and the easiness of manufacturing because they can be formed with the memory cells in the memory sections. However, the UV-PROM's in the redundancy control section must be shielded from ultra-violet rays so that the programmed information stored in the floating gate electrodes in the UV-PROM's in the redundancy control section is not eliminated during erasing operations for the UV-PROM's as the memory cell's in the memory cell sections. Therefore, in the prior art, the UV-PROM in the redundancy control section is covered by a metal layer. However, the metal layer can not be provided at a section where the control gate electrode is led out, and an aperture of the metal layer is inevitably formed there. Consequently, some ultra-violet rays are introduced into the metal cover structure through the aperture, and unfavorably eliminate the information, that is, unfavorably release electrons stored in the floating gate electrode.

SUMMARY OF THE INVENTION

Accordingly, an object of the present invention is to provide a semiconductor memory device in which an UV-PR0M is completely shielded from ultra-violet rays irradiating toward the whole chip area.

According to a feature of the present invention, there is provided a semiconductor memory device which comprises a semiconductor substrate of a first conductivity type, a non-volatile memory transistor formed on the substrate having a floating gate electrode and a control gate electrode, a first means for leading out the control gate electrode of the transistor, and a second means for shielding the floating gate electrode of the transistor. The first means includes a first impurity region of a second conductivity type opposite to the first conductivity type formed in the substrate and connected electrically at a first section thereof to the control gate electrode and a wiring layer connected to a second section of the first impurity section. The second means includes a second impurity region of the first conductivity type having a impurity concentration higher than the substrate and than the first impurity region, formed in the substrate and crossing the first impurity region between the first and second sections of the first impurity region, and a metallic film covering the floating gate electrode and the control gate electrode and contacted to the second impurity region. The metallic film may include a first metal layer of, for example, a first level aluminum layer surrounding the floating gate electrode, contacted to the second impurity region and crossing over the first impurity region, and a second metal layer of, for example, a second level aluminum layer provided above the floating gate electrode and the control gate electrode and contacted to the first metal layer.

According to another aspect of the present invention, there is provided a semiconductor memory device which comprises a semiconductor substrate of a first conductivity type, a main memory section provided in the substrate and having non-volatile memory transistors erasable by ultra-violet rays, a redundancy memory section provided in the substrate and having non-volatile memory transistors erasable by ultra-violet rays, and a redundancy control section for replacing electrically a part of the main memory section to a part of said redundancy memory section provided in the substrate and having a non-volatile memory transistor. The non-volatile memory transistor in the redundancy control section includes a pair of source and drain regions of a second conductivity type opposite to the first conductivity type formed in the substrate, a first impurity region of the second conductivity type formed in the substrate and connected to one of the source and drain regions, a second impurity region of the second conductivity type formed in the substrate, a third impurity region of the first conductivity type having a higher impurity concentration than the substrate and than the first and second impurity regions and formed in the substrate, the third impurity region having a ring-like shape, crossing the first and second impurity regions and surrounding the source and drain regions, a first gate insulating film formed on a channel region between the source and drain regions, a floating gate electrode formed on the first gate insulating film, a second gate insulating film formed on the floating gate electrode, a control gate electrode formed on the second gate insulating film and electrically connected to a first section of the second impurity region positioned inside the ring-like shape of the third impurity region, a first metal layer having a ring-like shape and contacted to the third impurity region in the entire length of the third impurity length such that the first metal layer surrounds the floating gate electrode entirely, a second metal layer formed above the floating and control gate electrodes and contacted to the first metal layer, a first wiring layer connected to a section of the first impurity region positioned outside the ring-like shape of the third impurity region, and a second wiring layer connected to a second section of the second impurity region positioned outside the ring-like shape of the third impurity region. The control gate may be electrically connected to the first section of the second impurity region through a third metal layer. The first and third metal layers and the first and second wiring layers may be made of a first level aluminum layer and the second metal layer may be made of a second level aluminum layer.

BRIEF DESCRIPTION OF THE DRAWINGS

FIG. 5A is a plan view showing an embodiment of the present invention, and FIGS. 5B and 5C are cross-sectional views taken along lines B—B' and C—C' in FIG. 5A as viewed in the direction of arrows, respectively.

DESCRIPTION OF THE PRESENT INVENTION

Figure 1:
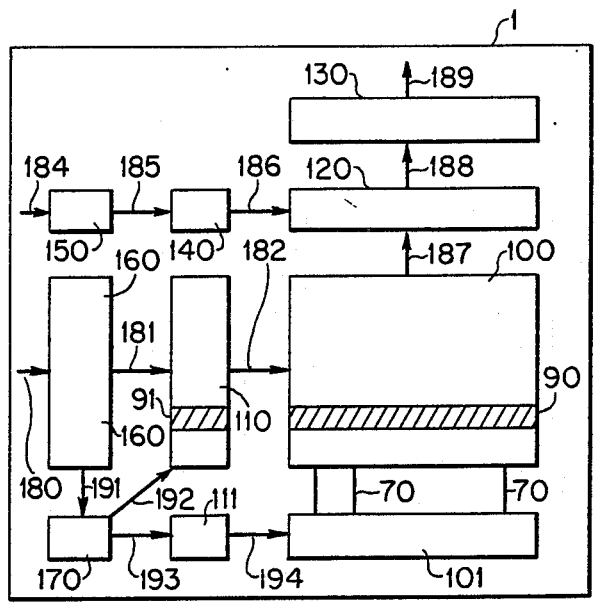
FIG. 1 is a layout diagram of one example of a semiconductor memory device having a redundancy memory cell section in a single semiconductor substrate.

Referring to FIG. 1, a memory device in a silicon substrate 1 is disclosed. X-address signals 180 are inputted to an X-address buffer section 160, and from the X-address buffer section 160, X-address buffer signals 181 are sent to an X-decoder section 110. X-decoder signals 182 from the X-decoder section 110 are sent to a main memory cell section 100 to select one of word lines corresponding to the X-address signals. Also, Y-address signals 184 are inputted to a Y-address buffer section 150, and from the Y-address buffer section 150, Y-address buffer signals 185 are sent to a Y-decoder section 140. Y-decoder signals 186 from the Y-decoder section 140 are sent to a sense amplifier 120 to select one of switching transistor connecting a selected digit line corresponding the Y-address signals. Output signals 187 from the memory array are sent to the sense amplifier section 120, and from the section 120, signals 188 are sent to an output circuit section 130 from which output signals 189 are outputted. Further, a redundancy memory cell section 101, a redundancy X-decoder section 111 and a redundancy control section 170 are incorporated in a single chip, that is, in the substrate 1. From the X-address buffer section 160, X-address buffer signals 191 which are the same signals as the signals 181 C are sent to the redundancy control section 170, and from the section 170, control signals 192 and 193 are sent to the X-decoder section 110 and to the redundancy X-decoder section 111, respectively. When a defect memory cell exist in a column line 90 in the main memory cell section 100 and the X-address signals 180 are of selecting the line 90, the operation of the X-decoder section 110 is stopped by the control signal 192 and the redundancy X-decoder section 111 is operated by the control signal 193 to select one of word lines in the redundancy memory cell section 101 by redundancy X-decoder signals 194. Namely, the defected word line 90 and the decoder circuit 91 connected to the line 90 is electrically replaced to one of word lines in the redundancy memory cell section and a decoder circuit in the redundancy decoder section 111 connected to the selected word line in the redundancy memory cell. Reversely, when any defect memory cell is not provided in a selected word line in the main memory cell section 100, the selected word line and a decoder circuit in the X-decoder section 110 are operated, and the redundancy memory cell section 101 and the redundancy X-decoder section 111 are not operated. Although the redundancy means for word lines including sections 170, 111, 101 is only disclosed in FIG. 1, the same redundancy means for digit lines can be added to or be replaced to the redundancy means for word lines.

Figure 2:
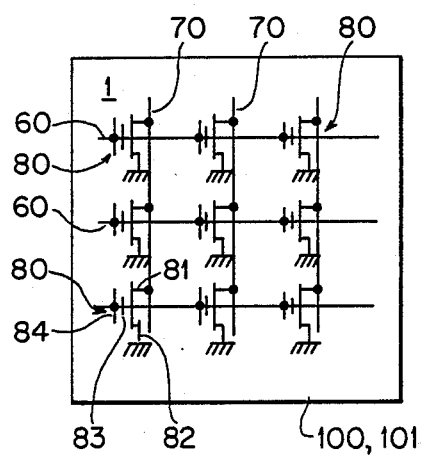
FIG. 2 is a circuit diagram showing one example of a main memory cell section and a part of a redundancy memory cell section in FIG. 1.

Referring to FIG. 2, in the main memory cell section 100, 256 word lines 60 (3 lines are exemplified) and 256 digit lines 70 (3 lines are exemplified) are provided, and a plurality of UV-PROM's 80 (9 PROM's are exemplified) are arranged in a matrix form and connected to respective word and digit lines. With respect to the redundancy memory cell section 101, 2 to 3 word lines 60 and 256 digit lines 70 are provided, and the same UV-PROM's 80 are arranged and connected to the respective word and digit lines. Each of UV-PROM's includes a pair of N-type source and N-type drain regions 81, 82 formed in the P-type silicon substrate 1, one region being connected to a digit line 70 and the other being connected to a ground potential line, a floating gate electrode 83 and a control gate electrode 84 connected to a word line 60. In the writing operation, electrons are injected into the floating gate electrodes of the selected UV-PROM's by an avalanche injection method in which a PN junction break down is produced between the N-type region 81 and the P-type substrate 1 with applying positive voltage to the control gate electrode 84, or by a channel injection method in which a high positive voltage is applied to the N-type region 81 to induce a high electric field between regions 81, 82 with applying a positive voltage to the control gate electrode 84. In the erasing operation, ultra-violet rays are irradiated to the whole surface of the substrate 1 so that the electrons stored in the floating gate electrodes of the selected UV-PROM's in the main memory cell section and the redundancy memory section are released from the floating gate electrodes.

Figure 3:
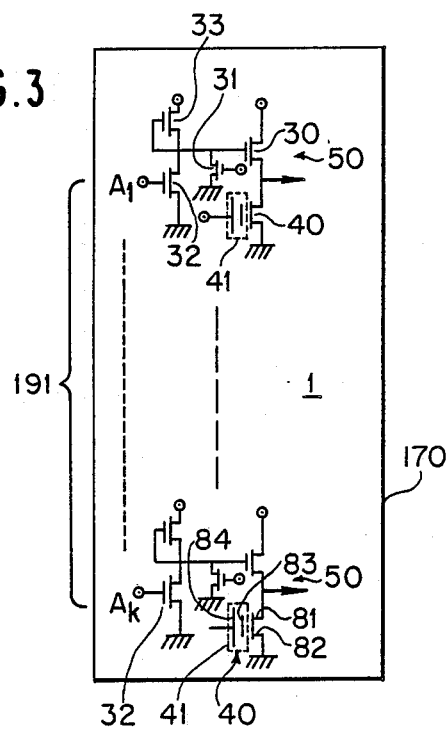
FIG. 3 is a circuit diagram showing one example of a part of a redundancy control section.

Referring to FIG. 3, a plurality of circuits 50 are arranged, and each circuit includes enhancement type MOS transistors 30, 31, 32, a depletion type MOS transistor 33, and an UV-PROM 40 which is covered by a metal layer 41. The UV-PROM 40 includes N-type source, drain regions 81, 82, the floating gate electrode 83 and the control gate electrode 84 which are the same components as those in UV-PROM 80 in memory sections 100, 101. Therefore, the UV-PROM's 40 and 80 are simultaneously manufactured each other, and electrons are injected into the floating gate electrodes of the selected UV-PROM's by the avalanche injection method or the channel injection method mentioned above. The X-address buffer signals 191 ($A_l \ldots A_k$) are inputted to the gate electrodes of the transistors 32 in respective circuits 50. In accordance to the defected word line 90 in the main memory cell section 100 (FIG. 1), the UV-PROM's 40 are selected, and electrons are injected into the floating gate electrodes of one group of UV-PROM's 40 through respective transistors 30 so that when X-address signals 180 which select the defect word line 90 are inputted, the proper control signals 192, 193 can be outputted from the redundancy control section 170 (FIG. 1). The electrical writing operations and the ultra-violet rays erasing operations are repeated in the main and redundancy memory cell sections 100, 101. However, the defect word line 90 once detected does not vary its position. Therefore, the UV-PROM's 40 in the redundancy control section 170 are covered by metal layers 41 as indicated in dotted line in FIG. 3 so that electrons injected and stored in the floating gate are not easily erased during the erasing operations by ultra-violet rays in the memory sections 100, 101.

Figure 4A:
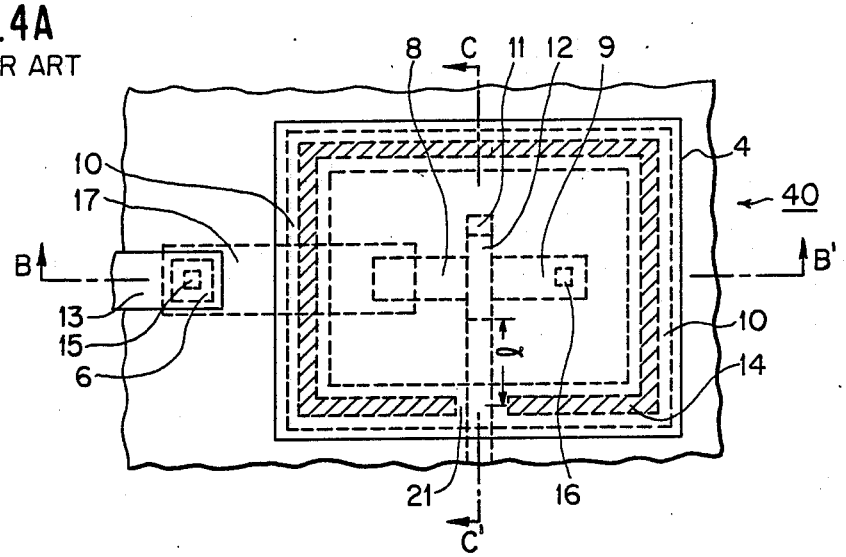
FIG. 4A is a plan view showing a prior art structure.
Figure 4B:
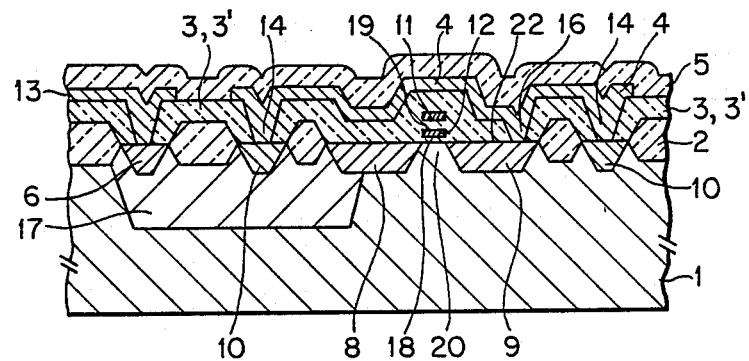
FIGS. 4B and 4C are cross-sectional views taken along lines B—B' and C—C' in FIG. 4A as viewed in the direction of arrows, respectively.
Figure 4C:
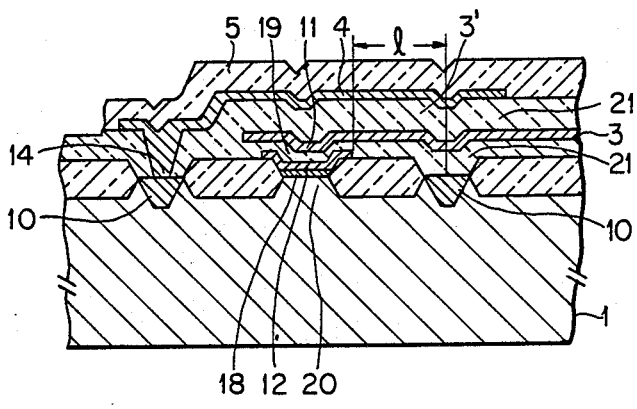

Referring to FIGS. 4A to 4C, a conventional UV-PROM 40 in the redundancy control section 170 is shown. A thick field silicon oxide layer 2 partially embedded is selectively formed in a major surface 22 of a P-type silicon substrate 1, and an N+-type drain region 8 and an N+-type source region 9 are formed. A first gate insulating film 18 of silicon oxide is formed on a channel region 20 between the source and drain regions 9, 8, and a floating gate electrode 12 of doped polysilicon is formed on the first gate insulating film 18 and extends on the field insulating layer 2 at both sides by 1 to 2 $\mu$m (FIGS. 4A, 4C). On the floating gate electrode 12, a second gate insulating film 19 of silicon oxide is formed, and a control gate electrode 11 of doped polysilicon is formed on the second gate insulating film 19. A first N-type impurity region 17 is formed in the substrate 1, contacted to the drain region 8 and led out by a metal wiring layer 13 of a first level aluminum layer which is contacted to an N+-type contact region 6 of the N-type region 17 through a contact hole 15 formed in inter-ply insulating films 3, 3'. A P+-type impurity region 10 having higher impurity concentration than the substrate 1 and the first N-type impurity region 17, formed in the substrate, surrounding the source and drain regions 9, 8 and crossing the first N-type impurity region 17. The control gate electrode 11 extends on a part of the inter-ply insulating film 3 above the field insulating layer 2, crosses over the P+-type impurity region 10 and be led out outwardly (FIG. 4C). A contact hole 14 indicated by right-upward hatching in FIG. 4A is formed in the inter-ply insulating films 3, 3' to expose the surface of the P+-type impurity region 10. As shown in FIGS. 4A, 4C, at a section where the control gate electrode 11 is leading out, the contact hole 14 cannot be formed. A metal layer 4 of a second aluminum layer is formed over the floating and control gate electrodes via the insulating film 3' and contacted to the P+-type impurity region 10 through the contact hole 14. The metal layer 4 is connected to the source region 9 through a contact hole 16, and a passivation insulating film 5 is entirely provided. Owing to the metal layer 4, unfavorable erasing of the information, for example of electrons stored in the floating gate electrode 12 by ultra-violet rays irradiation during the repeated erasing operations on the memory sections can be prevented in some extent. However, the metal layer 4 cannot be formed at the section where the control gate electrode 11 is led out, and an aperture 21 is inevitably provided at the side portion of the metal layer construction. Therefore, some ultra-violet rays enter in the metal layer structure through the aperture 21, travel in the structure by reflecting between the back surface, that is, the inner surface of metal layer 4 and the substrate, and finally reach to the floating gate electrode. Consequently, electrons stored in the floating gate electrode 12 are unfavorably released by the stray ultra-violet rays. To avoid this advantage, the length l between the edge of the floating gate electrode and the aperture must be long with a straight plan shape or a zigzag plan shape and a metal layer is provided along the shape. However, in a practical memory device, a long length l of 120 $\mu$m or more is necessary to eliminate the influence by the stray ultra-violet rays, obstructing to realize a high integrated density of the memory device.

Referring to FIGS. 5A to 5C, an UV-PROM 40 in an embodiment of the present invention installed in the redundancy control circuit will be explained. In FIGS. 5A to 5C, the same components as those in FIGS. 4A to 4C are indicated by the same reference numerals. A second N-type impurity region 76 having impurity concentration of $10^{16}$/cm$^3$ and 5 $\mu$m width and 20 $\mu$m length is formed in the P-type silicon substrate 1 of $10^{15}$/cm$^3$ impurity concentration, and N+-type contact regions 74 and 78 of high impurity concentration are provided in the end sections of the second N-type impurity region 76. Contact holes 75 and 79 are formed in a first level inter-ply insulating film 63 of silicon oxide to expose parts of the contact regions 74, 78. A metallic wiring layer 77 of a first level aluminum layer having 0.5 $\mu$m thickness is connected to the N+-type contact region 78 through the contact hole 79 and extends on the first level inter-ply insulating film 63, and a metallic wiring layer 73 made of the first level aluminum layer is connected to the N+-type contact region 74 through the contact hole 75 at one end portion, extends on the insulating film 63 and connected to a control gate electrode 61 of doped polysilicon at the other end through a contact hole 72 provided in a second level inter-ply insulating film 77 of silicon oxide. Therefore, the control gate electrode 61 formed on the second gate insulating film 19 is led out through the metallic layer 73, the second N-type impurity region 76 and the metallic layer 77. A P+-type impurity region 62 having a rectangular ring-like shape of 30 $\mu$m $\times$ 30 $\mu$m and having an impurity concentration higher than the P-type substrate 1 and than the first and second N-type impurity regions 17, 76 is formed in the substrate 1, surrounds completely the source, drain regions 9, 8 and crosses the first and second N-type impurity regions 17 and 76. A contact hole 65 is provided in the first level inter-ply insulating film 63 to expose the P+-type regions 62 at the entire length thereof such that the exposing contact hole surrounds completely the source and drain regions as indicated in right-upward hatching in FIG. 5A. A first metal layer 64 made of the first level aluminum layer is formed on the insulating film 63, having a higher level than the control gate electrode 61 and contacted to the P+-type region 62 through the contact hole 65 at the full length such that the first metal layer 64 surrounds completely the floating gate electrode 12 and the control gate electrode 61. The first metal layer 64 is connected at the portion 64' thereof to the source region 9 through a contact hole 69 provided in the insulating film 63. A contact hole 68 is provided in a third level inter-ply insulating film 66 of silicon oxide to expose the part of the first metal layer 64 at the entire length such that the exposing contact hole 68 has a ring-like shape as indicated by left-upward hatching in FIG. 5A. A second metal layer 67 of a second level aluminum layer of 1 $\mu$m thickness is formed on the insulating film 66, covers above the floating and control gate electrodes entirely and contacted to the first metal layer 64 at the entire contact hole 68. According to the present invention, the floating gate electrode 12 is completely sealed by the first and second metal layers 64, 67 and an aperture as in FIG. 4 is not provided. Therefore, during erasing operations for memory sections, ultra-violet rays irradiating toward the entire substrate never be reached to the floating gate electrode 12. Consequently, the informations stored in the floating gate electrode of the UV-PROM in the redundancy control section can keep the state beyond a long time with a high integrated circuit structure.

What is claimed is:

1. A semiconductor memory device comprising a semiconductor substrate of a first conductivity type, a non-volatile memory transistor formed on said substrate having a floating gate electrode and a control gate electrode, a first means for leading out said control gate electrode of said transistor, and a second means for shielding said floating gate electrode of said transistor, said first means including a first impurity region of a second conductivity type opposite to said first conductivity type formed in said substrate and connected electrically at a first section of said first impurity region to said control gate electrode through a first wiring layer made of a first level metal layer, and a second wiring layer made of said first level metal layer and connected to a second section of said first impurity region, said second means including a second impurity region of said first conductivity type having an impurity concentration higher than said substrate and than said first impurity region, formed in said substrate and crossing said first impurity region between said first and second sections of said first impurity region, and an metallic film covering said floating gate electrode and said control gate electrode and contacted to said second impurity region, said metallic film being composed of a lower metal layer made of said first level metal layer, connected to said second impurity region, crossing over said first impurity region and having a ring-like plan shape so as to surround said floating and control gate electrodes, and an upper metal layer made of a second level metal layer covering said floating and control gate electrodes and formed on and in contact with said lower metal layer.

2. A semiconductor memory device of claim 1, in which said first and second level metal layers are aluminum layers.

3. A semiconductor memory device comprising a semiconductor substrate of a first conductivity type, a main memory section provided in said substrate and having non-volatile memory transistors erasable by ultra-violet rays, a redundancy memory section provided in said substrate and having non-volatile memory transistors erasable by ultra-violet rays, and a redundancy control section for replacing electrically a part of said main memory section to a part of said redundancy memory section provided in said substrate and having a non-volatile memory transistor, said non-volatile memory transistor in said redundancy control section including a pair of source and drain regions of a second conductivity type opposite to said first conductivity type formed in said substrate, a first impurity region of said second conductivity type formed in said substrate and connected to one of said source and drain regions, a second impurity region of said second conductivity type formed in said substrate, a third impurity region of said first conductivity type having a higher impurity concentration than said substrate and than said first and second impurity regions and formed in said substrate, said third impurity region having a ring-like shape, crossing said first and second impurity regions and surrounding said source and drain regions, a first gate insulating film formed on a channel region between said source and drain regions, a floating gate electrode formed on said first gate insulating film, a second gate insulating film formed on said floating gate electrode, a control gate electrode formed on said second gate insulating film a first inter-ply insulating layer formed at least on said second impurity region and on said third impurity region, a first contact hole formed in said first inter-ply insulating layer to expose a first section of said second impurity region, said first section being positioned inside said ring-like shape of said third impurity region, a second contact hole formed in said first inter-ply insulating layer to expose a second section of said second impurity region, said second section being positioned outside said ring-like shape of said third impurity region, a third contact hole formed in said first inter-ply insulating layer to expose a contact section of said third impurity region, said contact section having a ring-like shape and surrounding said source and drain regions, a first wiring made of a first level metal layer connecting electrically said control gate electrode and said first section of said second impurity region through said first contact hole, a second wiring made of said first level metal layer connected to said second section of said second impurity region through said second contact hole, a first metal layer made of said first level metal layer, having an upper surface of a higher level than said control gate electrode from said substrate, and connected to the entire surface of said contact section of said third impurity region such that said first metal layer has a ring-like shape surrounding said source and drain regions and said floating and control gate electrodes and crossing over said first and second impurity regions, a second inter-ply insulating layer formed at least on said first and second wiring layers and on said first metal layer, a fourth contact hole formed in said second inter-ply insulating layer to expose a contact area of said upper surface of said first metal layer, said contact area having a ring-like shape along said shape of said first metal layer, and a second metal layer made of a second level metal layer, covering said floating and control gate electrodes and connected to the entire surface of said contact area of said upper surface of said first metal layer.

4. A semiconductor memory device of claim 3, in which said first and second level metal layers are aluminum layers.

* * * * *